United States Patent
Haruguchi et al.

(10) Patent No.: US 9,972,618 B2
(45) Date of Patent: May 15, 2018

(54) SEMICONDUCTOR DEVICE

(71) Applicant: Mitsubishi Electric Corporation, Tokyo (JP)

(72) Inventors: Hideki Haruguchi, Tokyo (JP); Yoshifumi Tomomatsu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days. days.

(21) Appl. No.: 15/325,465

(22) PCT Filed: Dec. 17, 2014

(86) PCT No.: PCT/JP2014/083418
§ 371 (c)(1),
(2) Date: Jan. 11, 2017

(87) PCT Pub. No.: WO2016/098199
PCT Pub. Date: Jun. 23, 2016

(65) Prior Publication Data
US 2017/0162562 A1 Jun. 8, 2017

(51) Int. Cl.
*H01L 29/739* (2006.01)
*H01L 29/08* (2006.01)
(Continued)

(52) U.S. Cl.
CPC ...... *H01L 27/0716* (2013.01); *H01L 29/0834* (2013.01); *H01L 29/1004* (2013.01);
(Continued)

(58) Field of Classification Search
None
See application file for complete search history.

(56) References Cited

U.S. PATENT DOCUMENTS

| 5,360,984 A | 11/1994 | Kirihata |
| 2007/0200138 A1 | 8/2007 | Ozeki et al. |

(Continued)

FOREIGN PATENT DOCUMENTS

| JP | 05-152574 A | 6/1993 |
| JP | 2007-227806 A | 9/2007 |

(Continued)

OTHER PUBLICATIONS

International Search Report issued in PCT/JP2014/083418; dated Feb. 17, 2015.
(Continued)

*Primary Examiner* — Seahvosh Nikmanesh
*Assistant Examiner* — Xiaoming Liu
(74) *Attorney, Agent, or Firm* — Studebaker & Brackett PC

(57) ABSTRACT

An IGBT includes an n-type drift layer, a p-type base layer and an n-type emitter layer formed on an upper surface of the n-type drift layer, and a p-type collector layer on a lower surface of the n-type drift layer. A FWD includes the n-type drift layer, a p-type anode layer formed on the upper surface of the n-type drift layer and an n-type cathode layer formed on the lower surface of the n-type drift layer. A p-type well is formed on the upper surface of the n-type drift layer in a wiring region and a termination region. A wiring is formed on the p-type well in the wiring region. The p-type well has a higher impurity concentration and is deeper than the p-type anode layer. The p-type well is not formed directly above the n-type cathode layer and is separate from a region directly above the n-type cathode layer.

9 Claims, 4 Drawing Sheets

(51) Int. Cl.
*H01L 27/07* (2006.01)
*H01L 29/423* (2006.01)
*H01L 29/10* (2006.01)
*H01L 29/861* (2006.01)

(52) U.S. Cl.
CPC ...... *H01L 29/1095* (2013.01); *H01L 29/4238* (2013.01); *H01L 29/7395* (2013.01); *H01L 29/861* (2013.01)

(56) References Cited

U.S. PATENT DOCUMENTS

| | | | |
|---|---|---|---|
| 2010/0200920 A1* | 8/2010 | Su | H01L 27/0255 257/355 |
| 2013/0087829 A1* | 4/2013 | Tanabe | H01L 29/66348 257/140 |
| 2014/0008718 A1* | 1/2014 | Toyoda | H01L 21/823412 257/330 |
| 2014/0084337 A1 | 3/2014 | Matsudai et al. | |

FOREIGN PATENT DOCUMENTS

| | | |
|---|---|---|
| JP | 2010-186805 A | 8/2010 |
| JP | 2011-243694 A | 12/2011 |
| JP | 2012-028567 A | 2/2012 |
| JP | 2014-103376 A | 6/2014 |

OTHER PUBLICATIONS

An Office Action; "Notification of Reasons for Refusal," mailed by the Japanese Patent Office dated Oct. 3, 2017, which corresponds to Japanese Patent Application No. 2016-564507 and is related to U.S. Appl. No. 15/325,465; with English translation.
Notification of Transmittal of Translation of the International Preliminary Report on Patentability and Translation of Written Opinion of the International Searching Authority; PCT/JP2014/083418; dated Jun. 29, 2017.

* cited by examiner

SEMICONDUCTOR DEVICE

FIELD

The present invention relates to an RC-IGBT wherein an FWD (Free Wheeling Diode) is incorporated in an IGBT (Insulated Gate Bipolar Transistor).

BACKGROUND

Losses in IGBTs or FWDs mounted on inverters or converters have been reduced year after year. Accordingly, current densities of chips have been improved and chip sizes have been reduced. In recent years, however, losses in IGBTs or FWDs are approaching a limit value, and development of power devices using SiC as a raw material and development of RC-IGBT having both of IGBT and FWD performance or the like are also underway.

Power devices using SiC as the raw material can be used at high temperatures and are also expected to be able to drastically reduce losses. However, power devices using SiC have problems like high prices of SiC wafer materials and faults caused by defects in SiC, and it is therefore estimated that it will take some time until the power devices using SiC are widely spread in the market.

In contrast, RC-IGBTs can be implemented by combining IGBTs and FWDs using Si as the raw material whose development has been advanced so far. If structures of an IGBT region and an FWD region can be optimized, it is possible to manufacture an RC-IGBT with stable yield using a current manufacturing apparatus. However, it is extremely difficult to simultaneously optimize the structures of the IGBT region and the FWD region and make their respective losses equivalent to losses of individually manufactured IGBT anti FWD.

In a normal FWD, a technique for shortening its lifetime in Si through Pt diffusion and irradiation of electron beams is adopted to reduce recovery losses. However, the RC-IGBT has a problem that if its lifetime in Si is shortened, a total loss of the IUBT (sign of on-time losses and switching losses) is increased.

In order to reduce recovery losses without shortening the lifetime in Si, it is effective to suppress injection of holes from the anode region when the FWD is forward-biased and energized. For that purpose, the concentration of the anode region is lowered. However, since holes are injected also from the P-type diffusion layer on the chip surface other than the anode region, attention needs to be paid to the design of the P-type diffusion layer other than the anode region.

In order to reduce recovery losses in, for example, the RC-IGBT, a technique is being proposed which forms no reverse side n$^+$ region which becomes the cathode layer of the diode directly below the P-type base layer of the IGBT (e.g., see PTL 1).

CITATION LIST

Patent Literature

[PTL 1] JP 5-152574 A

SUMMARY

Technical Problem

A small signal pad for connecting a gate or a built-in temperature sense diode to an external electrode via a wire and a gate wiring for electrically connecting a gate of each cell to a gate pad are formed in a wiring region of a substrate. Furthermore, an FLR (field limiting ring) for keeping a withstand voltage is formed in a termination region at the outer periphery of the substrate. A p-type well having a high impurity concentration and a greater depth for a p-type base layer of an IGBT or a p-type anode layer of an FWD is formed in these regions so as to be able to keep the withstand voltage. This p-type well is electrically connected to the P-type base layer of the IGBT or the p-type anode layer of the FWD. When the FWD is forward-biased, holes are injected from the p-type well and conventional RC-IGBTs have not provided sufficient interference prevention effects during recovery.

The present invention has been implemented to solve the above-described problems and it is an object of the present invention to provide a semiconductor device capable of reducing recovery losses of an FWD without increasing losses of an IGBT.

Solution to Problem

A semiconductor device according to the present invention a semiconductor device includes: an IGBT (Insulated Gate Bipolar Transistor) including an n-type drift layer, a p-type base layer and an n-type emitter layer formed on an upper surface of the n-type drift layer, and a p-type collector layer formed on a lower surface of the n-type drift layer; a FWD (Free Wheeling Diode) including the n-type drift layer, a p-type anode layer formed on the upper surface of the n-type drift layer and an n-type cathode layer formed on the lower surface of the n-type drift layer; a p-type well formed on the upper surface of the n-type drift layer in a wiring region and a termination region; and a wiring formed on the p-type well in the wiring region, wherein the p-type well has a higher impurity concentration and is deeper than the p-type anode layer, and the p-type well is not formed directly above the n-type cathode layer and is separate from a region directly above the n-type cathode layer.

Advantageous Effects of Invention

In the present invention, the p-type well is not formed directly above the n-type cathode layer and is separate from the region directly above the n-type cathode layer. Thus, while the FWD is forward-biased and energized, it is possible to reduce the amount of holes of the n$^-$-type drift layer in the region in which the FWD is formed. As a result, it is possible to reduce recovery losses of the FWD without increasing losses of the IGBT.

DESCRIPTION OF EMBODIMENTS

A semiconductor device according to the embodiments of the present inventions be described with reference to the drawings. The same components will be denoted by the same symbols, and the repeated description thereof may be omitted.

First Embodiment

Figure 1:
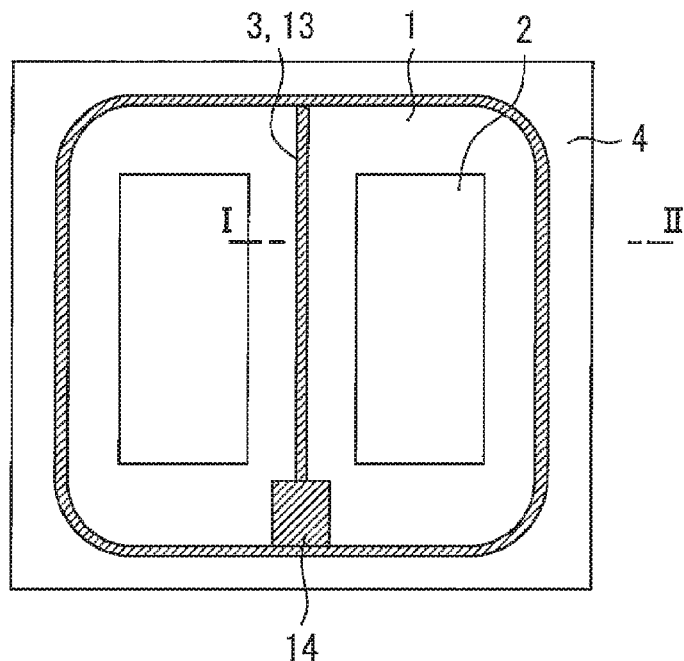
FIG. 1 is a plan view illustrating a semiconductor device according to a first embodiment of the present invention.
Figure 2:
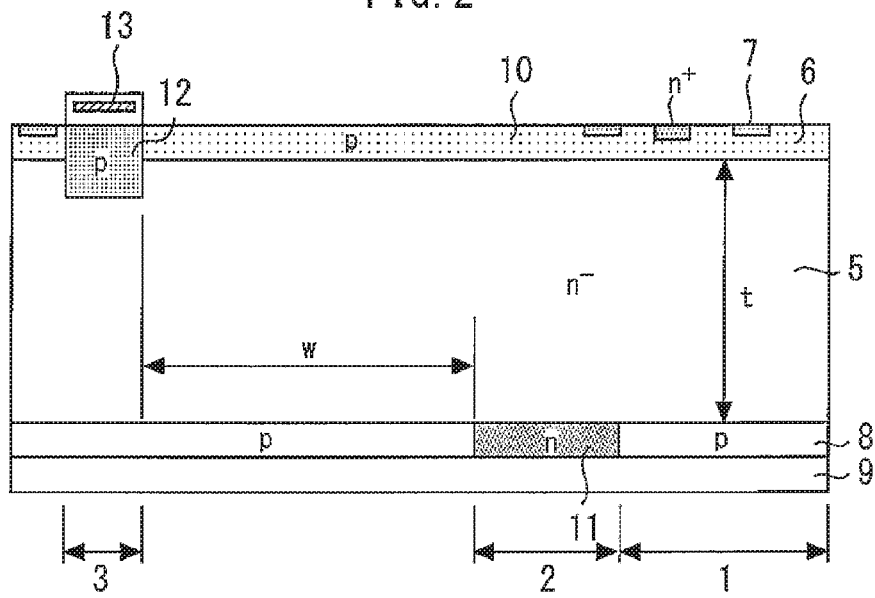
FIG. 2 is a cross-sectional view along in FIG. 1.

FIG. 1 is a plan view illustrating a semiconductor device according to a first embodiment of the present invention. FIG. 2 is a cross-sectional view along I-II in FIG. 1. This semiconductor device is an RC-IGBT in which an IGBT (Insulated Gate Bipolar Transistor) 1 and an FWD (Free Wheeling Diode) 2 are formed on one semiconductor substrate. In addition to the regions operating as the IGBT 1 and the FWD 2, a wiring region 3 exists in the RC-IGBT and a termination region 4 exists at the outer periphery thereof.

The IGBT 1 includes an n⁻-type drift layer 5, a p-type base layer 6 and an n⁺-type emitter layer 7 formed on the upper surface of the n⁻-type drift layer 5, and a p-type collector layer 8 formed on the lower surface of the n⁻-type drift layer 5. A collector electrode 9 is connected to the p-type collector layer 8, In a MOS structure on the upper surface side of the IGBT 1, electrons are supplied to the n"-type drift layer 5 through a channel by applying a voltage to the gate.

The FWD 2 includes the n⁻-type drift layer 5, a p-type anode layer 10 formed on the upper surface of the n⁻-type drift layer 5 and an n-type cathode layer 11 formed on the lower surface of the n⁻-type drift layer 5.

A p-type well 12 is formed on the upper surface of the n⁻-type drift layer 5 so as to keep a withstand voltage in the wiring region 3 and the termination region 4. In the wiring region, a gate wiring 13 and a gate pad 14 are formed on the p-type well 12 as wiring. The gate wiring 13 electrically connects the gate pad 14 and the gate of each cell. The wiring region is also provided with a small signal pad (not shown) to connect a temperature sense diode built in the IGBT 1 to an external electrode via a wire. Furthermore, an FLR (field limiting ring) is formed in the termination region to keep the withstand voltage. These wirings do not generate any inversion layer in the p-type well 12 unlike the gate electrode that generates an inversion region.

The p-type well 12 has a higher impurity concentration and is deeper than the p-type anode layer 10. The p-type well 12 is not formed directly above the n-type cathode layer 11 but is separate from the region directly above the n-type cathode layer 11.

Figure 3:
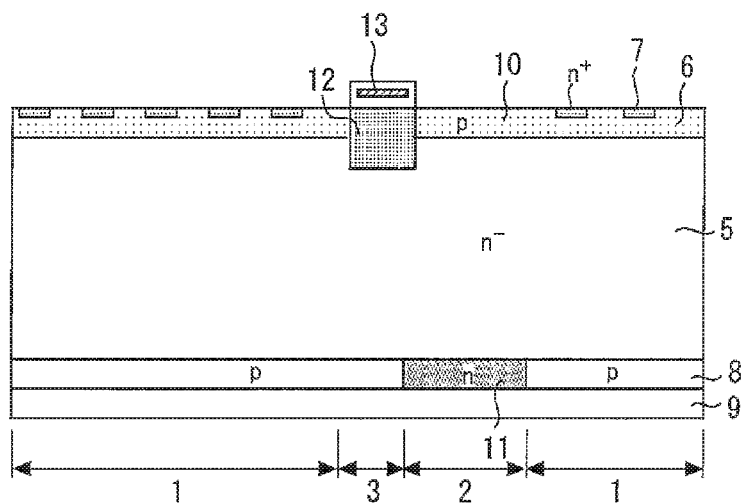
FIG. 3 is a cross-sectional view illustrating a semiconductor device according to a comparative example.

Next, effects of the present embodiment will be described in comparison with a comparative example. FIG. 3 is a cross-sectional view illustrating a semiconductor device according to a comparative example. In the comparative example, part of the p-type well 12 is formed directly above the n-type cathode layer 11. For this reason, when the FWD 2 is forward-biased, holes are injected from the p-type well 12 into the region in which the FWD 2 is formed, causing the interference prevention effect during recovery to become insufficient.

On the other hand, in the present embodiment, the p-type well 12 is not formed directly above the n-type cathode layer 11 and is separate from the region directly above the n-type cathode layer 11. Thus, while the FWD 2 is forward-biased and energized, it is possible to reduce the amount of holes of the n⁻-type drift layer 5 in the region in which the FWD 2 is formed. As a result, it is possible to reduce recovery losses of the FWD without increasing losses of the IGBT.

Considering that holes injected from the p-type well 12 on the upper surface are diffused toward the n-type cathode layer 11 on the lower surface at 45 degrees diagonally downward, the p-type well 12 is preferably separate from the region directly above the n-type cathode layer 11 by at least a thickness t of the n⁻-type drift layer 5 to reduce recovery losses of the FWD 2 (w≥t in FIG. 2).

Furthermore, it is preferable that the n⁺-type emitter layer 7 is not formed in the region of the FWD 2, and the p-type base layer 6 and the p-type anode layer 10 have the same depth and concentration. Simply depending on whether the n⁺-type emitter layer 7 is formed or not, the IGBT 1 and the FWD 2 can be formed separate from each other. Furthermore, when forming an upper surface structure of the RC-IGBT, it is possible to reduce the number of steps by making wafer processes of the IGBT 1 and the FWD 2 common and manufacture the RC-IGBT at low cost with high performance.

Second Embodiment

Figure 4:
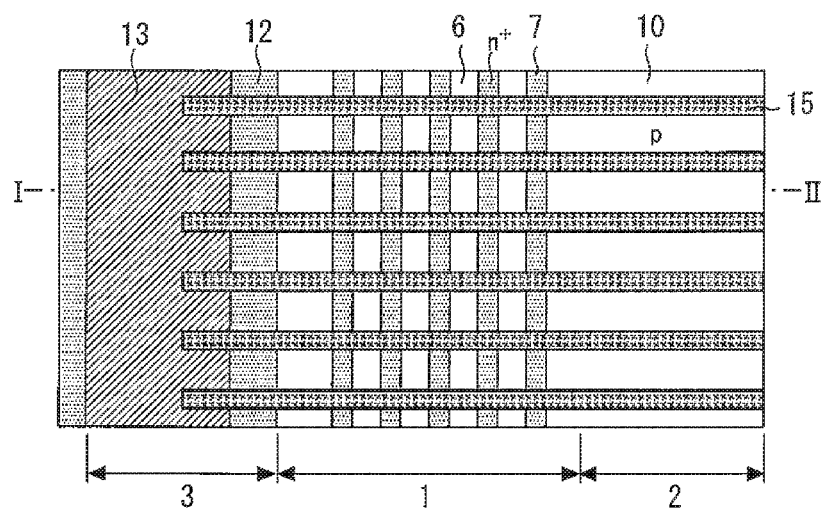
FIG. 4 is a plan view illustrating a semiconductor device according to a second embodiment of the present invention.
Figure 5:
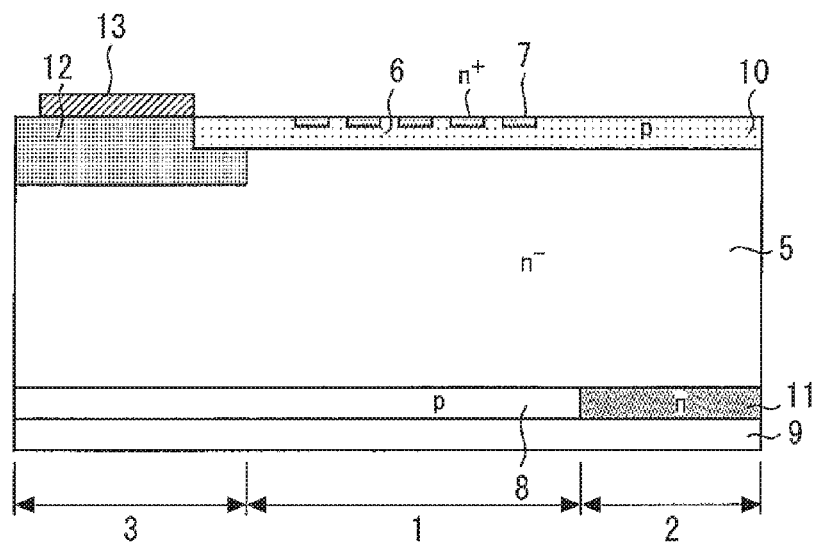
FIG. 5 is a cross-sectional view along in FIG. 4.

FIG. 4 is a plan view illustrating a semiconductor device according to a second embodiment of the present invention. FIG. 5 is a cross-sectional view along I-II in FIG. 4. A plurality of trench gates 15 are formed. The IGBT 1 is formed in a region between the wiring region 3 and the termination region 4, and the FWD 2. By forming the IGBT 1 in the vicinity of the wiring region 3 and the termination region 4, it is possible to reduce recovery losses of the FWD 2 without reducing an effective area of the elements (the total area of the energizable IGBT 1 and FWD 2).

Third Embodiment

Figure 6:
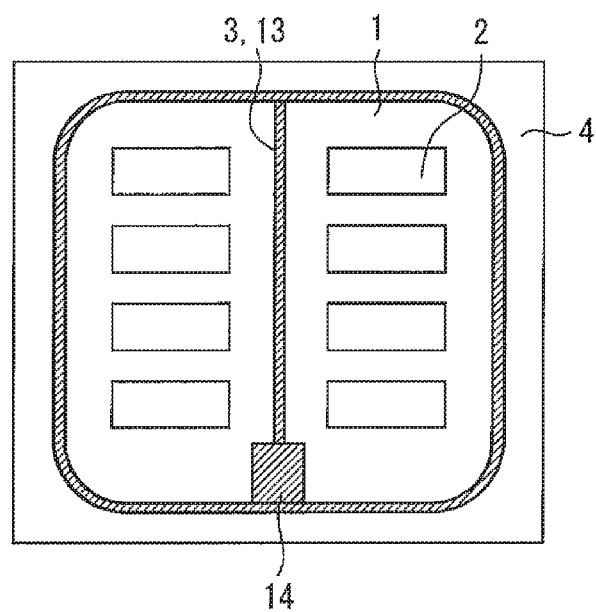
FIG. 6 is a plan view illustrating a semiconductor device according to a third embodiment of the present invention.

FIG. 6 is a plan view illustrating a semiconductor device according to a third embodiment of the present invention. The IGBT 1 and the FWD 2 are repeatedly formed at a certain interval within a region surrounded by the gate wiring 13 in the plan view. The IGBT 1 and the FWD 2 within the RC-IGBT generate heat when a current is applied thereto. A maximum rated temperature of the elements is generally 150 to 175° C. and it is necessary to cool a radiator fin contacting the lower surface of the RC-IGBT using air or water to lower the temperature of the heated elements. In normal usage, a period during which a current flows through the IGBT 1 and a period during which a current flows through the FWD 2 appear alternately and there is a difference between timings at which temperatures of the IGBT 1 and the FWD 2 reach a peak. Thus, by repeatedly forming the IGBT 1 and the FWD 2 at a certain interval, it is possible to allow heat generated during energization of one of the IGBT 1 and the FWD 2 to escape to a radiator fin of the other region and efficiently lower the temperatures of the elements. Moreover, it is possible to reduce the size of the chip accordingly and simplify the cooling mechanism, and thereby reduce the cost of the elements and an inverter that incorporates the elements.

Fourth Embodiment

Figure 7:
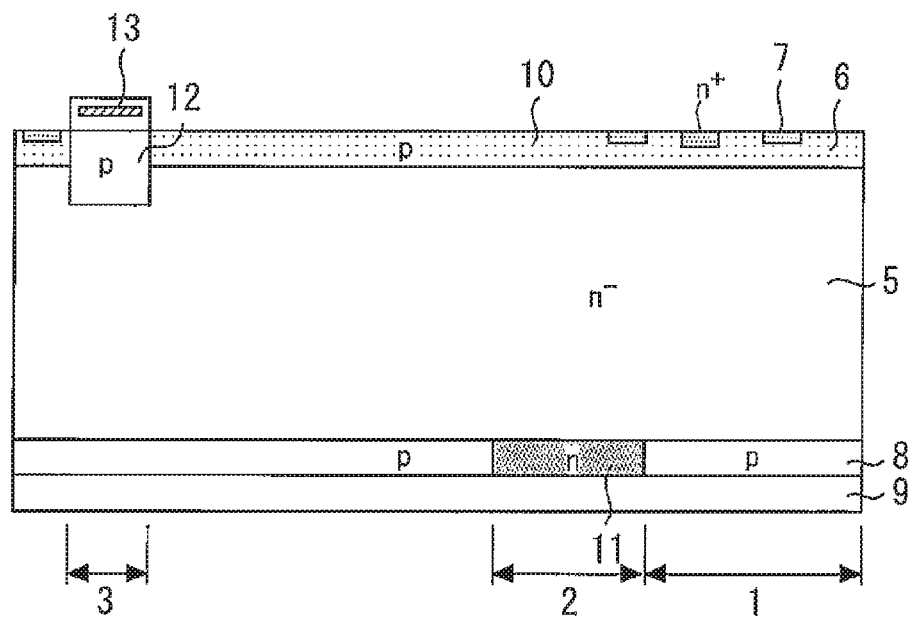
FIG. 7 is a cross-sectional view illustrating a semiconductor device according to a fourth embodiment of the present invention.

FIG. 7 is a cross-sectional view illustrating a semiconductor device according to a fourth embodiment of the present invention. In the present embodiment, the p-type well 12 is deeper and has a lower impurity concentration than the p-type anode layer 10. Thus, even when the FWD 2 is formed in the vicinity of the p-type well 12, it is possible to reduce the amount of holes injected from the p-type well 12 during energization of the FWD 2 and reduce recovery losses of the FWD 2.

Fifth Embodiment

Figure 8:
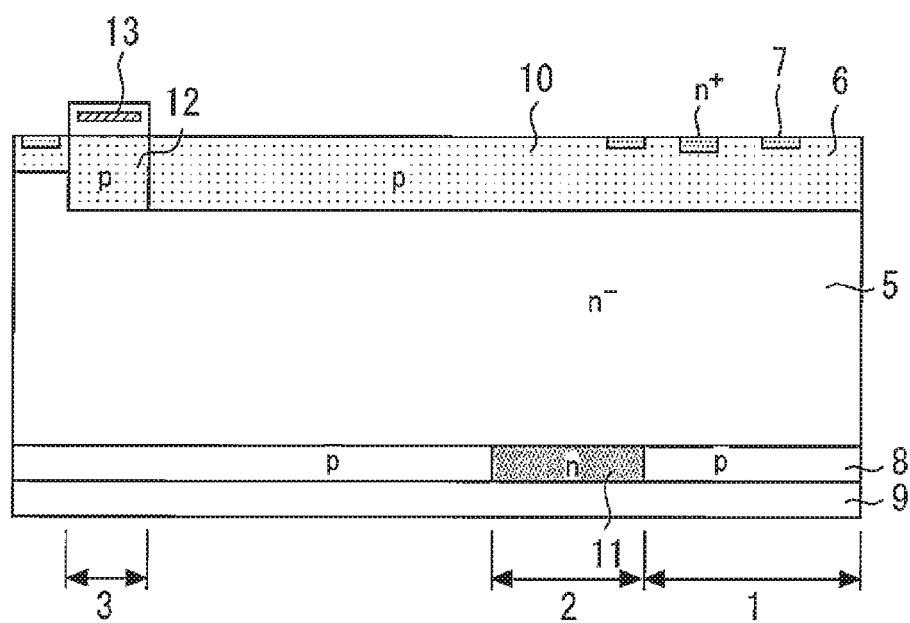
FIG. 8 is a cross-sectional view illustrating a semiconductor device according to fifth embodiment of the present invention.

FIG. 8 is a cross-sectional view illustrating a semiconductor device according to a fifth embodiment of the present invention. In the present embodiment, the p-type well 12 has the same impurity concentration and the same depth as those of the p-type anode layer 10. Thus, even when the FWD 2 is formed in the vicinity of the p-type well 12, it is possible to reduce the amount of holes injected from the p-type well 12 during energization of the FWD 2 and reduce recovery losses of the FWD 2.

Furthermore, the p-type well 12 and the p-type anode layer 10 are formed by simultaneously injecting and diffusing P-type impurity. In this way, it is possible to reduce the number of steps in a wafer process and manufacture the RC-IGBT at low cost and with high performance.

Note that the semiconductor substrate is not limited to one formed of silicon, but may also be formed of a wide band gap semiconductor having a wider band gap than silicon. Examples of the wide band gap semiconductor include silicon carbide, nitride gallium-based material or diamond. A semiconductor device formed of such a wide band gap semiconductor has a high withstand voltage and a high allowable current density, and can thereby be downsized. Using this downsized device also allows a semiconductor module incorporating this device to be downsized. Furthermore, since the elements have high heat resistance, the radiator fin of the heat sink can be downsized, the water cooling system be substituted by an air cooling system, making it possible to further downsize the semiconductor module. Moreover, since power losses of the element are reduced and the elements have high efficiency, it is possible to improve efficiency of the semiconductor module.

REFERENCE SIGNS LIST

1 IGBT, 2 FWD, 3 wiring region, 4 termination region, 5 n⁻-type drift layer, 6 p-type base layer, 7 n⁺-type emitter layer, 8 p-type collector layer, 10 p-type anode layer, 11 n-type cathode layer, 12 p-type well, 13 gate wiring

The invention claimed is:

1. A semiconductor device comprising:
an IGBT (Insulated Gate Bipolar Transistor) including an n-type drift layer, a p-type base layer and an n-type emitter layer formed on an upper surface of the n-type drift layer, and a p-type collector layer formed on a lower surface of the n-type drift layer;
a FWD (Free Wheeling Diode) including the n-type drift layer, a p-type anode layer formed on the upper surface of the n-type drift layer and an n-type cathode layer formed on the lower surface of the n-type drift layer;
a p-type well formed on the upper surface of the n-type drift layer in a wiring region and a termination region; and
a wiring formed on the p-type well in the wiring region, wherein the p-type well has a higher impurity concentration and is deeper than the p-type anode layer,
the p-type well is not formed directly above the n-type cathode layer and is separate from a region directly above the n-type cathode layer, and
the p-type well is separate from the region directly above the n-type cathode layer by at least a thickness of the n-type drift layer, and
the wiring formed on the p-type well in the wiring region is connected to a small signal electrode, a magnitude of a small signal in the small signal electrode being less than a magnitude of a signal through the emitter and collector layers when the IGBT is in an on state.

2. The semiconductor device according to claim 1, wherein the n-type emitter layer is not formed in a region of the FWD, and
the p-type base layer and the p-type anode layer have the same depth and concentration.

3. The semiconductor device according to claim 1, wherein the IGBT is formed in a region between the wiring region and the termination region, and the FWD.

4. The semiconductor device according to claim 1, wherein the IGBT and the FWD are repeatedly formed at a certain interval in a plan view.

5. The semiconductor device according to claim 1, wherein the IGBT includes a gate electrode and the wiring is connected to the gate electrode.

6. A semiconductor device comprising:
an IGBT including an n-type drift layer, a p-type base layer and an n-type emitter layer formed on an upper surface of the n-type drift layer, and a p-type collector layer formed on a lower surface of the n-type drift layer;
a FWD including the n-type drift layer, a p-type anode layer formed on the upper surface of the n-type drift layer and an n-type cathode layer formed on the lower surface of the n-type drift layer;
a p-type well formed on the upper surface of the n-type drift layer in a wiring region and a termination region; and
a wiring formed on the p-type well in the wiring region, wherein the p-type well is deeper and has a lower impurity concentration than the p-type anode layer, and
the wiring formed on the p-type well in the wiring region is connected to a small signal electrode, a magnitude of a small signal in the small signal electrode being less than a magnitude of a signal through the emitter and collector layers when the IGBT is in an on state.

7. The semiconductor device according to claim 6, wherein the IGBT includes a gate electrode and the wiring is connected to the gate electrode.

8. A semiconductor device comprising:
an IGBT including an n-type drift layer, a p-type base layer and an n-type emitter layer formed on an upper surface of the n-type drift layer, and a p-type collector layer formed on a lower surface of the n-type drift layer;
a FWD including the n-type drift layer, a p-type anode layer formed on the upper surface of the n-type drift layer and an n-type cathode layer formed on the lower surface of the n-type drift layer;
a p-type well formed on the upper surface of the n-type drift layer in a wiring region and a termination region; and
a wiring formed on the p-type well in the wiring region, wherein the p-type well has the same impurity concentration and the same depth as those of the p-type anode layer, and the p-type anode layer is directly connected to the p-type well.

9. The semiconductor device according to claim 8, wherein the p-type well and the p-type anode layer are formed by simultaneously injecting and diffusing P-type impurity.

* * * * *